United States Patent
Kerr

(10) Patent No.: US 6,554,941 B2
(45) Date of Patent: Apr. 29, 2003

(54) METHOD OF IMAGE REVERSAL OF A PRE-PRESS COLOR PROOF BY MEANS OF LAMINATION

(75) Inventor: Roger S. Kerr, Brockport, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/943,269

(22) Filed: Aug. 30, 2001

(65) Prior Publication Data

US 2003/0041958 A1 Mar. 6, 2003

(51) Int. Cl.⁷ .................. B44C 1/165; B32B 31/20; B32B 9/00; B41M 3/12; B41M 3/00
(52) U.S. Cl. .................. 156/230; 156/239; 156/240; 156/241; 156/247; 156/277; 156/289; 427/148; 428/41.8; 428/42.1; 428/202; 428/347; 428/914
(58) Field of Search .................. 156/230, 231, 156/233, 234, 235, 237, 239, 240, 241, 247, 277, 289; 428/40.1, 41.1, 41.5, 41.6, 41.8, 42.1, 195, 200, 202, 343, 344, 347, 414; 427/146, 147, 148; 503/227

(56) References Cited

U.S. PATENT DOCUMENTS

| | | | |
|---|---|---|---|
| 5,203,942 A | | 4/1993 | DeCook et al. |
| 5,268,707 A | | 12/1993 | Harshbarger et al. |
| 5,278,576 A | * | 1/1994 | Kaszczuk et al. ............ 346/1.1 |
| 5,342,821 A | * | 8/1994 | Pearce ............ 503/27 |
| 5,478,434 A | | 12/1995 | Kerr et al. |
| 5,837,375 A | * | 11/1998 | Brault et al. ............ 428/411.11 |
| 5,897,735 A | * | 4/1999 | Peskin ............ 156/230 |
| 6,022,440 A | * | 2/2000 | Nordeen et al. ............ 156/241 |

OTHER PUBLICATIONS

Roger S. Kerr, "Laminator Assembly Having a Pressure Roller with a Deformable Layer", USSN 09/676,877 (Attorney Docket No. 78274/NAB), filed Sep. 29, 2000.

* cited by examiner

Primary Examiner—J. A. Lorengo
(74) Attorney, Agent, or Firm—Nelson Adrian Blish

(57) ABSTRACT

Method for laminating a pre-press proof (200), whereby an imaged receiver sheet (140) with a representative image (290) having been written with an incorrect orientation can be salvaged, which comprises the steps of laminating a pre-laminate sheet (240) to a sheet of receiver stock and removing the first support layer (150). Laminating an imaged receiver sheet (140) consisting of a representative image (290) that has been formed with an incorrect orientation on a second thermoplastic layer (304) and a second support layer (170) to an imageless receiver sheet (160) consisting of a third thermoplastic layer (306) and a third support layer (180). Thereby encapsulating the representative image (290) between the second thermoplastic layer (304) and third thermoplastic layer (306) and removing the second support layer (170) forming a laminated imaged receiver sheet (190). Laminating the laminated imaged receiver sheet (190) to said pre-laminated receiver stock and removing the third support layer (180) forming a pre-press proof (200) with a correct image orientation.

11 Claims, 4 Drawing Sheets

METHOD OF IMAGE REVERSAL OF A PRE-PRESS COLOR PROOF BY MEANS OF LAMINATION

FIELD OF THE INVENTION

The present invention relates to the art of color proofing, and in particular, to a method of reversing an image when forming a pre-press proof, such as by the use of pressure and heat to laminate media together.

BACKGROUND OF THE INVENTION

Pre-press proofing is a procedure that is used primarily by the printing industry for creating representative images of printed material. In the printing industry pre-press color proofs are used to check for color balance, control parameters and other important image quality requirements, without the cost and time that is required to actually produce printing plates, set up a printing press and produce an example of a representative image, which would result in higher costs and a loss of profits that would ultimately be passed on to the customer.

To create a pre-press proof first an original image is separated into individual color separations or digital files. The original image is scanned and separated into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof The second, a single integral sheet process in which the separate colors for the representative image is transferred one at a time by lamination onto a single base. The third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of thermal print media in which colorant from a sheet of colorant donor material is transferred to the thermal print media, by applying a sufficient amount of thermal energy to the colorant donor sheet material to form the representative image. The image processing apparatus is comprised generally of a material supply assembly and a lathe bed scanning subsystem. The scanning subsystem includes: a lathe bed scanning frame, translation drive, translation stage member, printhead, imaging drum, and media exit transports.

The operation of the image processing apparatus includes metering a length of the thermal print media (in roll form) from the material supply assembly. The thermal print media is then measured and cut into sheet form of the required length and transported to the imaging drum, registered, wrapped around, and secured onto the imaging drum. Next, a length of colorant donor material (in roll form) is also metered out of the material supply assembly, then measured and cut into sheet form of the required length. The colorant donor material is then transported to the imaging drum and wrapped around the imaging drum utilizing a load roller which is described in detail, in commonly assigned U.S. Pat. No. 5,268,708, such that it is superposed in the desired registration with respect to the thermal print media (which has already been secured to the imaging drum).

After the colorant donor sheet material is secured to the periphery of the imaging drum the scanning subsystem or write engine provides the imaging function. This image function is accomplished by retaining the thermal print media and the colorant donor sheet material on the imaging drum while it is rotated past the printhead. The translation drive traverses the printhead and translation stage member axially along the axis of the imaging drum, in coordinated motion with the rotating imaging drum. These movements combine to produce the representative image on the thermal print media.

Once the representative image has been formed on the thermal print media, the colorant donor sheet material is then removed from the imaging drum. This is accomplished without disturbing the thermal print media that is beneath it. The colorant donor sheet material is then transported out of the image processing apparatus by means of the material exit transport. Additional colorant donor sheet materials featuring other desired colorants are sequentially superimposed with the thermal print media on the imaging drum and then imaged onto the thermal print media as previously mentioned, until the representative image is completed on the thermal print media. The representative image formed thereon is then unloaded from the imaging drum and transported by the receiver sheet material exit transport to an exit tray in the exterior of the image processing apparatus.

After a representative image has been formed on the thermal print media as previously described it is transferred to a receiver stock such that the pre-press proof is representative of the image that will be printed by the printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and pending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a thermal print layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

The above described lamination method works well with both laser thermal and inkjet pre-press proofs, once an original image is scanned and separated into color separations or digital files. If, when printed to a receiver sheet, it is not oriented correctly, or written inreverse in the case of a transferable receiver, the image laminated to paper will be reversed thus rendering the imaged receiver sheet unusable adding cost and loss of profits. Thus, there exists a need to be able to salvage an image receiver sheet having an incorrect orientation.

SUMMARY OF THE INVENTION

The present invention provides a method of correcting an imaged receiver sheet having an incorrect orientation created by a pre-press proof on the plastic materials. The novel methods are preferably for forming a pre-press proof with a resolution of about 1000 and about 4000 dpi and most preferably having a resolution of about 1800 to 3000 dpi.

Specifically the invention is for a method of lamination of a pre-press proof, whereby an imaged receiver sheet with an image having been written with an incorrect orientation can be salvaged, which comprises the steps of laminating a pre-laminate sheet consisting of a first thermoplastic layer, first support layer having a first support base, and a first release layer. The first support layer may be comprised of several layers or a single support base laminated to a sheet of paper that the representative image would be printed on in the printing press to be known as receiver stock. The first support layer is removed forming a pre-laminated receiver stock. An imaged receiver sheet, consisting of a representative image that has been formed with an incorrect orientation is laminated on a second thermoplastic layer and a second support layer; having a second support base, first aluminized layer and second release layer. The second support layer may be comprised of several layers or a single support base. An imageless receiver sheet consists of a third thermoplastic layer and a third support layer having a third support base, second aluminized layer and a third release layer. The third support layer may be comprised of several layers or a single support base. The representative image is encapsulated between the second thermoplastic layer and third thermoplastic layer and the second support layer is removed forming a laminated image receiver sheet with a corrected image orientation. The laminated image receiver sheet is laminated to the pre-laminated receiver stock and the third support layer is removed forming a pre-press proof with a correct image orientation.

A method of laminating a pre-press proof, whereby an imaged receiver sheet with an image having been written with an incorrect orientation is salvaged, which comprises the steps of laminating an imaged receiver sheet consisting of a representative image that has been formed with an incorrect orientation on a first thermoplastic layer and a first support layer; having a first support base, first aluminized layer and first release layer. It should be noted that the first support layer may be comprised of several layers or a single support base. An imageless receiver sheet consisting of a second thermoplastic layer and a second support layer having a second support base, second aluminized layer and a second release layer. The second support layer may be comprised of several layers or a single support base. The representative image is encapsulated between the first thermoplastic layer and the second thermoplastic layer and the first support layer is removed forming a laminated image receiver sheet with a corrected image orientation. The laminated image receiver sheet is laminated to a receiver stock and the second support layer is removed forming a pre-press proof with a correct image orientation.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for laminating pre-press proofs.

Figure 1:
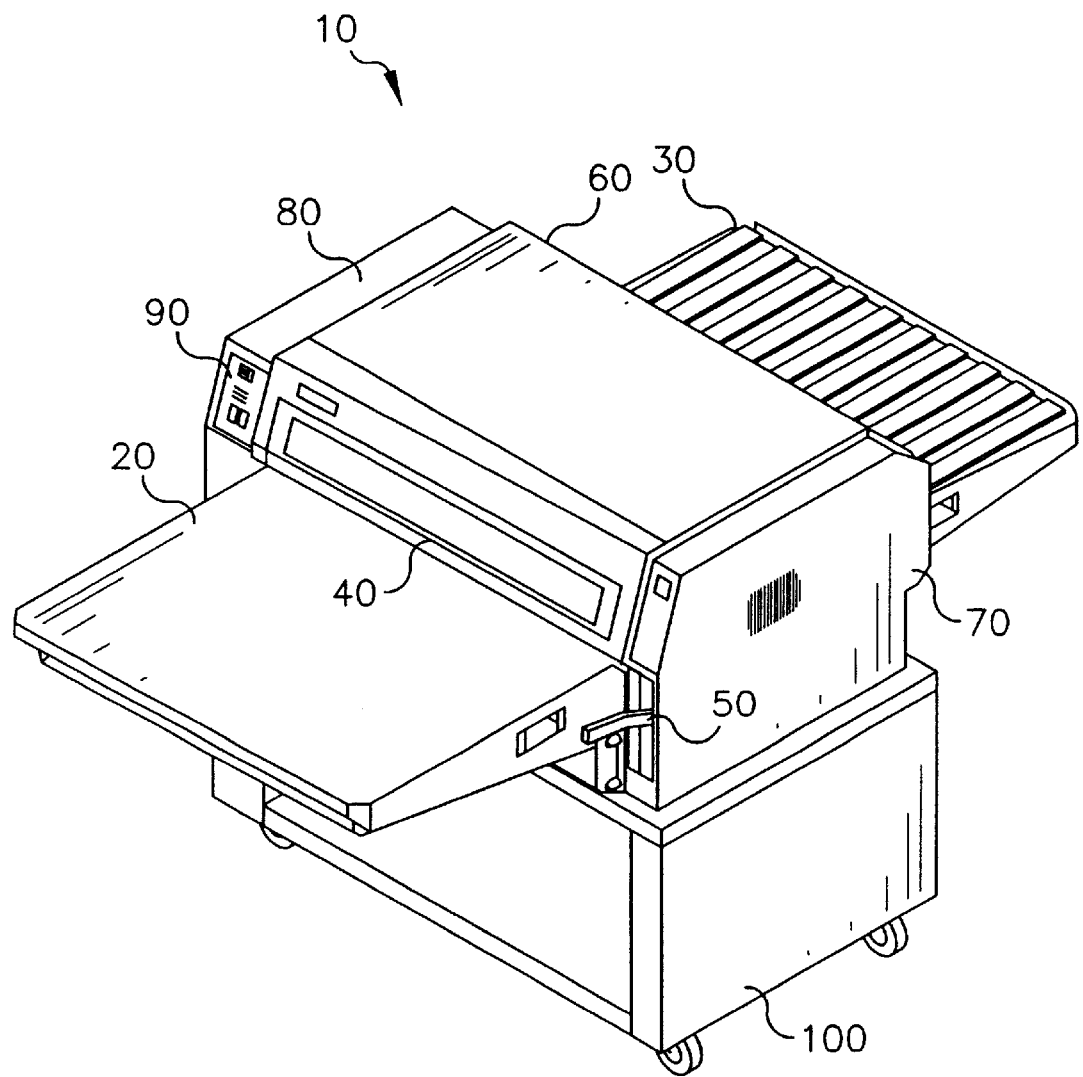
FIG. 1 is a perspective view showing a laminator known in the related art used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator has an entrance table 20, exit table 30, entrance slot 40, pressure lever 50, top cover 60, right side cover 70, left side cover 80, control panel 90, and lamination base 100.

Figure 2:
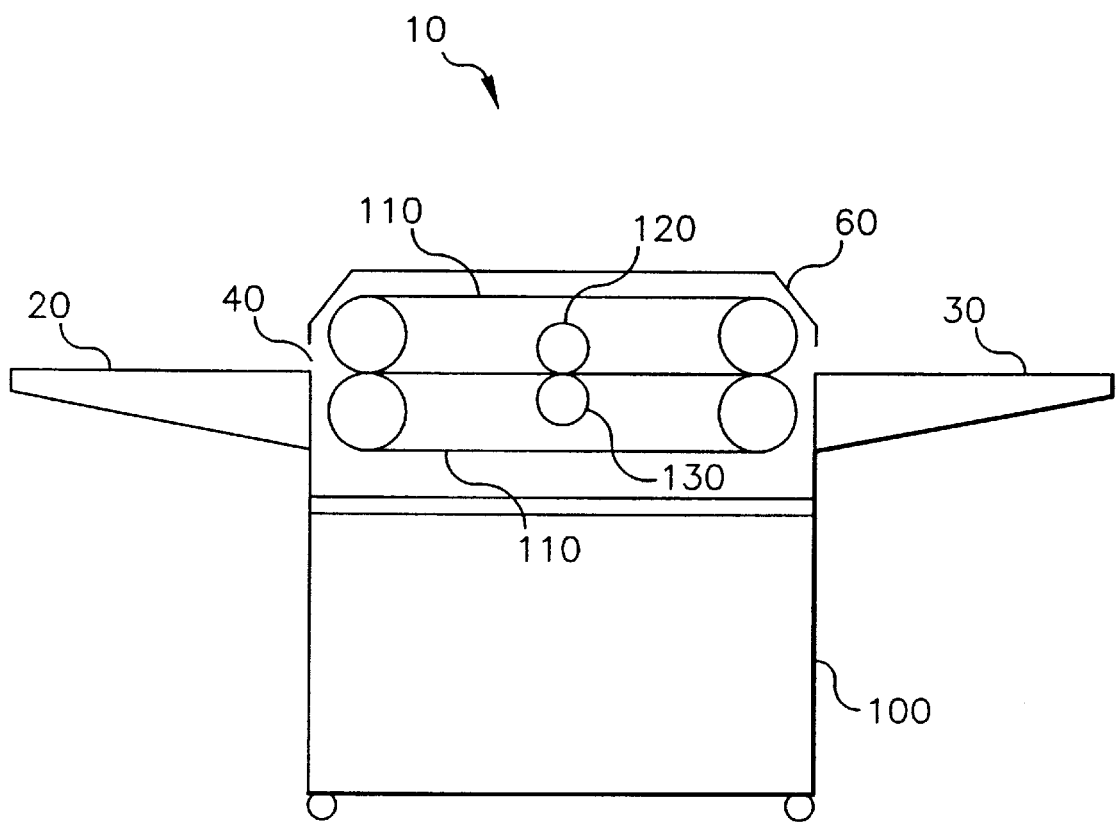
FIG. 2 is a schematic right side elevation of the laminator of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it should also be recognized that only one of the upper lamination roller 120 and lower lamination roller 130 may be heated. It is further recognized that both upper lamination roller 120 and lower lamination roller 130 do not have to be heated for cold lamination applications.

The following methods are usable for forming a pre-press proof 200 with a resolution of between about 1000 and 4000 dpi, although in the most preferred embodiment, the resolution is between 1800 and 4000 dpi.

Generally laminating a pre-press proof 200 of this type is a two-pass process, the present invention contemplates a single pass construction as well. The image can be initially created on thermal print media with an inkjet printer, laser printer, or any other printing method known in the art.

Figure 3:
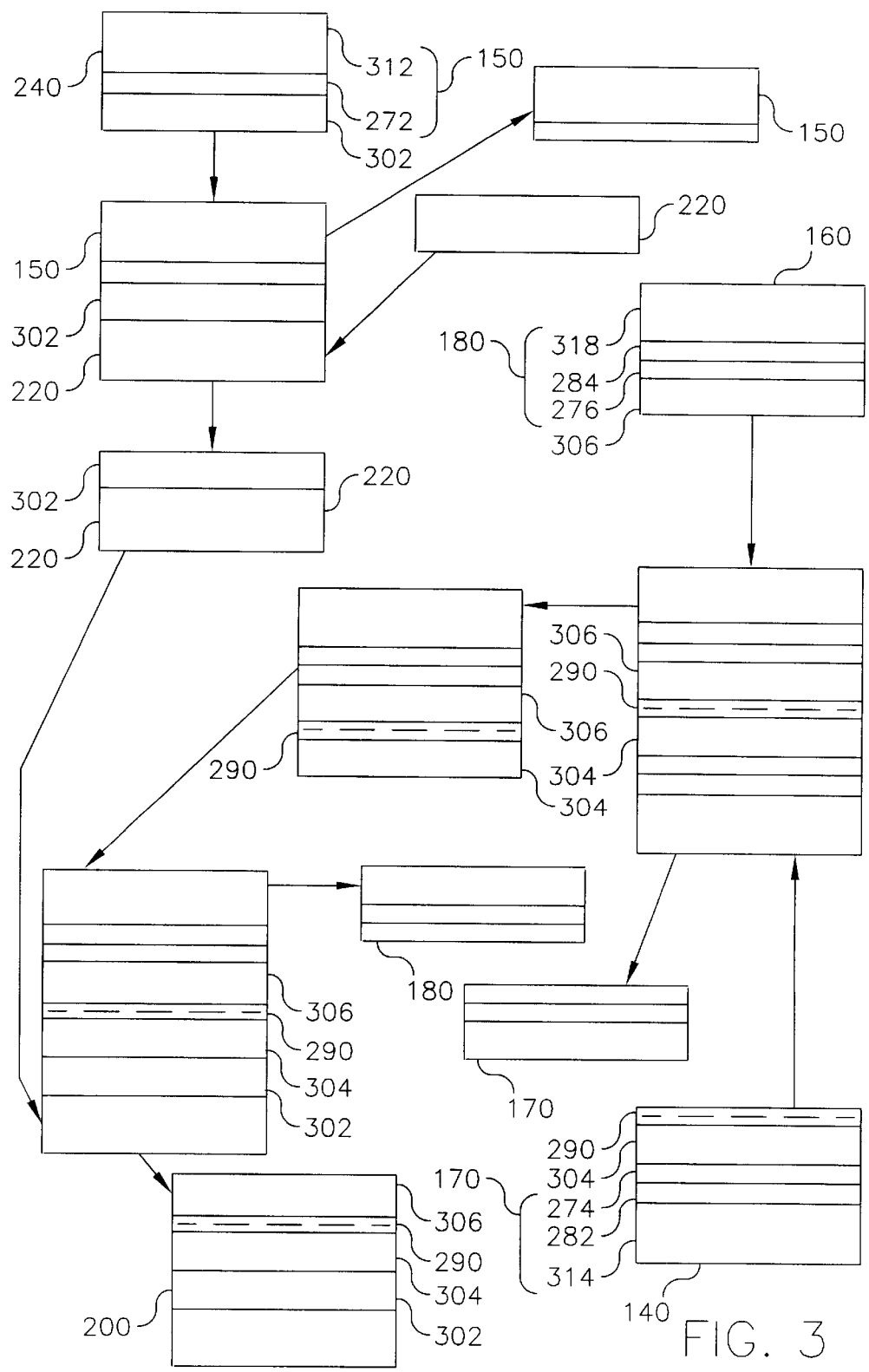
FIG. 3 is a block diagram showing one embodiment of the method for producing a pre-press proof of the invention.

Referring to FIG. 3 a block diagram is shown outlining a method for laminating a pre-press proof 200, whereby an imaged receiver sheet 140 with a representative image 290 having been written with an incorrect orientation can be salvaged, which comprises the steps of: laminating a pre-laminate sheet 240 consisting of a first thermoplastic layer 302 and first support layer 150 having a first support base 312 and a first release layer 272. It should be noted that the first support layer 150 may be comprised of several layers or a single support base to a sheet of material that the representative image 290 would be printed on in the printing press to be known as receiver stock 220. Removing the first support layer 150 forming a pre-laminated receiver stock. Laminating an imaged receiver sheet 140 consisting of a representative image 290 that has been formed with an incorrect orientation on a second thermoplastic layer 304 and a second support layer 170; having a second support base 314, first aluminized layer 282 and second release layer 274. It should be noted that the second support layer 170 may be comprised of several layers or a single support base to an imageless receiver sheet 160 consisting of a third thermoplastic layer 306 and a third support layer 180; having a third support base 318, second aluminized layer 284 and a third release layer 276. It should be noted that the third support layer 180 may be comprised of several layers or a single support base. Thereby encapsulating the representative image 290 between the second thermoplastic layer 304 and third thermoplastic layer 306 and removing the second support layer 170 forming a laminated imaged receiver sheet 190 with a now corrected image orientation. Laminating the laminated imaged receiver sheet 190 to the pre-laminated receiver stock removing the third support layer 180 forming a pre-press proof 200 with a correct image orientation.

Figure 4:
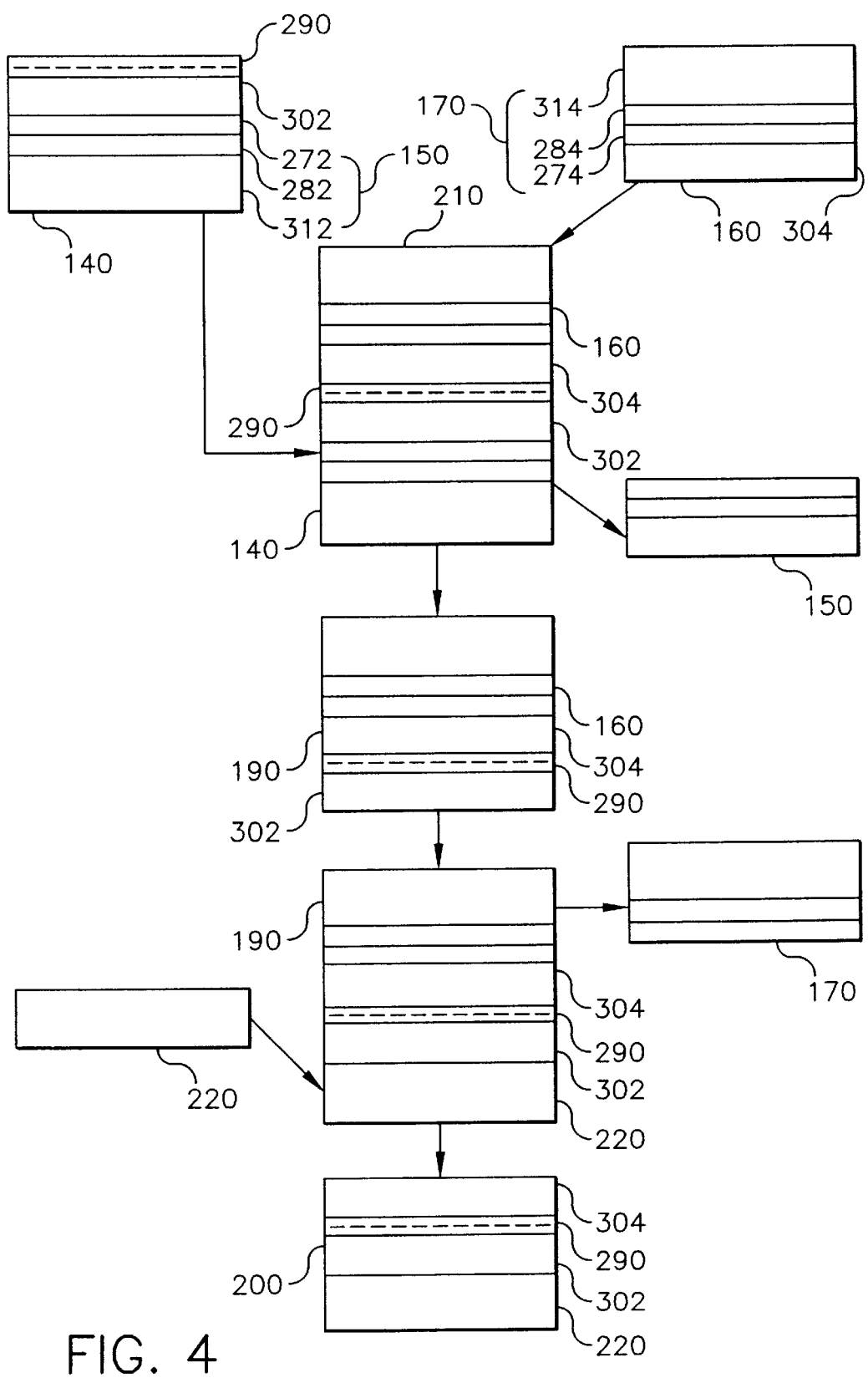
FIG. 4 is a block diagram showing a second embodiment of the method for producing a pre-press proof.

Referring to FIG. 4 a block diagram is shown outlining another embodiment of the invention. A method for laminating a pre-press proof 200, whereby an imaged receiver sheet 140 with a representative image 290 having been written with an incorrect orientation is salvaged, which comprises the steps of: laminating an imaged receiver sheet 140 consisting of a representative image 290 that has been formed with an incorrect orientation on a first thermoplastic layer 302 and a first support layer 150; having a first support base 312, first aluminized layer 282 and first release layer 272. It should be noted that the first support layer 150 may be comprised of several layers or a single support base. An imageless receiver sheet 160 consisting of a second thermoplastic layer 304 and a second support layer 170; having a second support base 314, second aluminized layer 284 and a second release layer 274. It should be noted that the second support layer 170 may be comprised of several layers or a single support base. Thereby encapsulating the representative image between the first thermoplastic layer 302 and second the thermoplastic layer 304: removing said first support layer 150 forming a laminated image receiver sheet 190 with a now corrected image orientation. Laminating the laminated image receiver sheet 190 to a receiver stock 220 and removing the second support layer 170 forming a pre-press proof 200 with a correct image orientation.

The invention has been described in detail with particular reference to certain preferred embodiments thereof, but it will be understood that variations and modifications can be effected within the scope of the invention.

PARTS LIST

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Imaged receiver sheet
150. First support layer
160. Imageless receiver sheet
170. Second support layer
180. Third support layer
190. Laminate imaged receiver sheet
200. Pre-press proof
220. Receiver stock
240. Pre-laminate sheet
272. First release layer
274. Second release layer
276. Third release layer
282. First aluminized layer
284. Second aluminized layer
290. Representative image
302. First thermoplastic layer
304. Second thermoplastic layer
306. Third thermoplastic layer
312. First support base
314. Second support base
318. Third support base

What is claimed is:

1. A method for laminating a pre-press proof comprising:

laminating a pre-laminate sheet of material comprising of a first thermoplastic layer, and first support layer to a receiver stock;

removing the first support layer forming a pre-laminated receiver stock;

laminating an imaged receiver sheet comprising a second thermoplastic layer and second support layer to an imageless receiver stock consisting of a third thermoplastic layer, and third support layer;

wherein said second thermoplastic layer has an image with an incorrect orientation;

removing said second support layer, laminating said laminated imaged receiver sheet to said pre-laminated receiver stock; and removing said third support layer forming a pre-press proof.

2. The method of claim 1 wherein said first support layer is comprised of a support base and release layer.

3. The method of claim 1 wherein said second support layer is comprised of a support base and release layer.

4. The method of claim 1 wherein said second support layer is comprised of a support base, release layer, and an aluminized layer.

5. The method of claim 1 wherein said third support layer is comprised of a support base, release layer, and an aluminized layer.

6. A pre-press proof with a resolution of between 1000 dpi and 4000 dpi formed by the method of claim 1.

7. A pre-press proof with a resolution of between 1800 dpi and 3000 dpi formed by the method of claim 1.

8. The method of claim 1 wherein said imaged receiver sheet comprises a monochrome image.

9. The method of claim 1 wherein said imaged receiver sheet comprises a multi colored image.

10. The method of claim 1 wherein said first thermoplastic layer has a thickness between 1 and 75 microns.

11. The method of claim 1 wherein the image is an inkjet generated image.

* * * * *